(12) United States Patent
Vermersch et al.

(10) Patent No.: US 8,753,906 B2
(45) Date of Patent: Jun. 17, 2014

(54) METHOD FOR MANUFACTURING A STRUCTURE WITH A TEXTURED SURFACE FOR AN ORGANIC LIGHT-EMITTING DIODE DEVICE, AND STRUCTURE WITH A TEXTURED SURFACE

(75) Inventors: Francois-Julien Vermersch, Paris (FR); Hélène Gascon, Paris (FR); Sophie Besson, Compiegne (FR)

(73) Assignee: Saint-Gobain Glass France, Courbevoie (FR)

( * ) Notice: Subject to any disclaimer, the term of this patent is extended or adjusted under 35 U.S.C. 154(b) by 108 days.

(21) Appl. No.: 13/260,970

(22) PCT Filed: Apr. 2, 2010

(86) PCT No.: PCT/FR2010/050638
§ 371 (c)(1),
(2), (4) Date: Dec. 22, 2011

(87) PCT Pub. No.: WO2010/112786
PCT Pub. Date: Oct. 7, 2010

(65) Prior Publication Data
US 2012/0091488 A1 Apr. 19, 2012

(30) Foreign Application Priority Data
Apr. 2, 2009 (FR) ...................... 09 52127

(51) Int. Cl.
*H01L 33/58* (2010.01)
(52) U.S. Cl.
USPC ............... 438/29; 257/98; 257/173; 257/305; 257/498; 257/623; 257/E33.074; 257/E51.108; 257/E33.073; 257/40; 313/505; 313/498; 428/58; 428/213; 428/444
(58) Field of Classification Search
USPC ...................... 428/173; 204/298.13; 361/234; 313/505; 427/250, 299; 257/40, 257/E51.018; 438/29
See application file for complete search history.

(56) References Cited

U.S. PATENT DOCUMENTS

| 4,649,432 A | 3/1987 | Watanabe et al. |
| 5,280,373 A | 1/1994 | Ozawa et al. |

(Continued)

FOREIGN PATENT DOCUMENTS

| DE | 197 33 053 | 2/1999 |
| DE | 20 2005 000 9 | 7/2006 |

(Continued)

OTHER PUBLICATIONS

Richard Leach, "Surface Texture using Stylus Instruments" from Measurement Good Practice Guide No. 37, Jul. 2001, reproduced by permission of the Controller of HMSO, NPL Teddington, UK.*

(Continued)

*Primary Examiner* — Jerome Jackson, Jr.
*Assistant Examiner* — Bo Fan
(74) *Attorney, Agent, or Firm* — Pillsbury Winthrop Shaw Pittman LLP

(57) ABSTRACT

A method for manufacturing a structure having a textured surface, including a substrate made of mineral glass having a given texture, for an organic-light-emitting-diode device, the method including supplying a rough substrate, having a roughness defined by a roughness parameter Ra ranging from 1 to 5 μm over an analysis length of 15 mm and with a Gaussian filter having a cut-off frequency of 0.8 mm; and depositing a liquid-phase silica smoothing film on the substrate, the film being configured to smooth the roughness sufficiently and to form the textured surface of the structure.

16 Claims, 2 Drawing Sheets

(56) References Cited

U.S. PATENT DOCUMENTS

| | | | |
|---|---|---|---|
| 5,346,770 | A | 9/1994 | Osada et al. |
| 5,667,853 | A | 9/1997 | Fukuyoshi et al. |
| 5,772,862 | A * | 6/1998 | Ando et al. .............. 204/298.13 |
| 5,962,115 | A | 10/1999 | Zmelty et al. |
| 6,014,196 | A | 1/2000 | Anzaki et al. |
| 6,040,056 | A | 3/2000 | Anzaki et al. |
| 6,045,896 | A | 4/2000 | Boire et al. |
| 6,414,431 | B1 | 7/2002 | Yu et al. |
| 6,489,045 | B1 | 12/2002 | Araki et al. |
| 7,049,757 | B2 | 5/2006 | Foust et al. |
| 7,161,171 | B2 | 1/2007 | Dahmani et al. |
| 2002/0008286 | A1 | 1/2002 | Yamazaki et al. |
| 2003/0049464 | A1 | 3/2003 | Glenn et al. |
| 2003/0162333 | A1 | 8/2003 | Kim et al. |
| 2003/0186064 | A1 | 10/2003 | Murata et al. |
| 2004/0001915 | A1 | 1/2004 | He et al. |
| 2004/0017152 | A1 * | 1/2004 | Hashimoto et al. ........... 313/505 |
| 2004/0031957 | A1 | 2/2004 | Tyan |
| 2004/0032220 | A1 | 2/2004 | Cok et al. |
| 2004/0081855 | A1 | 4/2004 | Kim et al. |
| 2004/0113146 | A1 | 6/2004 | Dahmani et al. |
| 2004/0149984 | A1 | 8/2004 | Tyan et al. |
| 2004/0227462 | A1 | 11/2004 | Utsumi et al. |
| 2004/0245918 | A1 | 12/2004 | Lee |
| 2005/0000564 | A1 | 1/2005 | Sato et al. |
| 2005/0073228 | A1 | 4/2005 | Tyan et al. |
| 2005/0073251 | A1 | 4/2005 | Kato |
| 2005/0124257 | A1 | 6/2005 | Maeuser |
| 2005/0162071 | A1 | 7/2005 | Lee et al. |
| 2005/0199904 | A1 | 9/2005 | Yamamoto |
| 2005/0264185 | A1 | 12/2005 | Hoffmann |
| 2006/0043886 | A1 | 3/2006 | Lee et al. |
| 2006/0091791 | A1 | 5/2006 | Shin |
| 2006/0124933 | A1 | 6/2006 | Kang |
| 2006/0152833 | A1 | 7/2006 | Halls et al. |
| 2006/0209551 | A1 | 9/2006 | Schwenke et al. |
| 2006/0269786 | A1 | 11/2006 | Shin et al. |
| 2006/0290841 | A1 | 12/2006 | Kwon et al. |
| 2007/0047170 | A1 * | 3/2007 | Sun et al. ..................... 361/234 |
| 2007/0206263 | A1 | 9/2007 | Neuman et al. |
| 2008/0100202 | A1 | 5/2008 | Cok |
| 2008/0193721 | A1 * | 8/2008 | Ukelis et al. .................. 428/173 |
| 2010/0072884 | A1 | 3/2010 | Tchakarov et al. |
| 2010/0117523 | A1 | 5/2010 | Tchakarov |
| 2010/0225227 | A1 | 9/2010 | Tchakarov et al. |

FOREIGN PATENT DOCUMENTS

| | | |
|---|---|---|
| EP | 0 733 931 | 9/1996 |
| EP | 0 747 330 | 12/1996 |
| EP | 0 847 965 | 6/1998 |
| EP | 1 329 307 | 7/2003 |
| EP | 1 387 406 | 2/2004 |
| EP | 1 396 676 | 3/2004 |
| EP | 1 403 939 | 3/2004 |
| EP | 1 521 305 | 4/2005 |
| EP | 1 693 483 | 8/2006 |
| EP | 1 717 876 | 11/2006 |
| FR | 2 844 136 | 3/2004 |
| JP | 10-100303 | 4/1998 |
| JP | 10-217378 | 8/1998 |
| JP | 11-070610 | 3/1999 |
| JP | 2001-243840 | 9/2001 |
| JP | 2002-015623 | 1/2002 |
| JP | 2002-313139 | 10/2002 |
| JP | 2002-313572 | 10/2002 |
| JP | 2004-022438 | 1/2004 |
| JP | 2008-066027 | 3/2008 |
| WO | WO 99/02017 | 1/1999 |
| WO | WO 2004/057674 | 7/2004 |
| WO | WO 2005/041620 | 5/2005 |
| WO | WO 2005/053053 | 6/2005 |
| WO | WO 2005/124887 | 12/2005 |
| WO | WO 2006/013373 | 2/2006 |
| WO | WO 2007/096565 | 8/2007 |
| WO | WO 2008/029060 | 3/2008 |
| WO | WO 2008/059185 | 5/2008 |

OTHER PUBLICATIONS

Kloeppel, A., et al., "Dependence of the electrical and optical behaviour of ITO-silver-ITO multilayers on the silver properties", Thin Solid Films, Elsevier, vol. 365, No. 1, pp. 139-146, Apr. 1, 2000.

Jung, Yeon Sik, et al., "Effects of thermal treatment on the electrical and optical properties of silver-based indium tin oxide / metal / indium tin oxide structures", Thin Solid Films, Elsevier, vol. 440, No. 1-2, pp. 278-284, Sep. 1, 2003.

International Search Report as issued for International Patent Application No. PCT/FR2010/050638, dated Nov. 10, 2010.

C.H. Jeong, et al., "Four-wavelength white organic light-emitting diodes using 4,4'-bis-[carbazoyl-(9)]-stilbene as a deep blue emissive layer", Organic Electronics 8, 2007, pp. 683-689.

* cited by examiner

METHOD FOR MANUFACTURING A STRUCTURE WITH A TEXTURED SURFACE FOR AN ORGANIC LIGHT-EMITTING DIODE DEVICE, AND STRUCTURE WITH A TEXTURED SURFACE

CROSS-REFERENCE TO RELATED APPLICATIONS

This application is the U.S. National Stage of PCT/FR2010/050638, filed Apr. 2, 2010, which in turn claims priority to French Application No. 0952127, filed Apr. 2, 2009. The content of both applications are incorporated herein by reference in their entirety.

The invention relates to a method for manufacturing a structure having a textured surface comprising a substrate made of mineral glass having a textured surface, for an organic-light-emitting-diode device, and such a structure.

An OLED, or organic light-emitting diode, comprises an organic light-emitting material or a multilayer of organic light-emitting materials, and is framed by two electrodes, one of the electrodes, the anode, consisting of that associated with the glass substrate and the other electrode, the cathode, being arranged on the organic materials, opposite the anode.

The OLED is a device that emits light via electroluminescence using the recombination energy of holes injected from the anode and electrons injected from the cathode. In the case where the anode is transparent, the emitted photons pass through the transparent anode and the glass substrate supporting the OLED so as to supply light beyond the device.

OLEDs are generally used in display screens or more recently in lighting devices, however with different constraints.

For a lighting system, the light extracted from the OLED is "white" light because certain or even all of the wavelengths of the visible spectrum are emitted. The light must furthermore be emitted uniformly. In this respect one speaks more precisely of Lambertian emission, i.e. emission obeying Lambert's law and characterized by a photometric luminance that is equal in all directions.

Moreover, OLEDs have low light-extraction efficiencies: the ratio between the light that actually exits from the glass substrate and that emitted by the light-emitting materials is relatively low, about 0.25. This phenomenon is especially explained by the fact that a certain number of photons remain trapped between the cathode and the anode.

Solutions are therefore sought to improve the efficiency of OLEDs, namely to increase the extraction efficiency while supplying white light that is as uniform as possible. The term "uniform" is, in the remainder of the description, understood to mean uniform in intensity, color and in space.

It is known to provide, at the glass-anode interface, a periodically protruding structure that forms a diffraction grating and thus makes it possible to increase the extraction efficiency.

Document US 2004/0227462 specifically shows an OLED the transparent substrate of which, supporting the anode and the organic film, is textured. The surface of the substrate thus comprises an alternation of protrusions and troughs the profile of which is followed by the anode and the organic film which are deposited above. The profile of the substrate is obtained by applying a photoresist mask to the surface of the substrate, the pattern of the mask corresponding to that sought for the protrusions, and then etching the surface through the mask.

However, such a method is not easy to implement industrially over large substrate areas, and is above all too expensive, especially for lighting applications.

Furthermore, electrical defects are observed in the OLEDs.

The invention therefore has the object of providing a method for manufacturing a support for a polychromatic (white) OLED that makes it possible both to increase the amount of light extracted from the OLED and to provide both a sufficiently uniform white light and increased reliability.

According to the invention, the method for manufacturing a structure having a textured surface, comprising a substrate made of mineral glass having a given texture, for an organic-light-emitting-diode device, comprises:

supplying a rough substrate, having a roughness defined by a roughness parameter Ra ranging from 1 to 5 µm, preferably ranging from 1 to 3 µm, over an analysis length of 15 mm and with a Gaussian filter having a cut-off frequency of 0.8 mm; and depositing a liquid-phase silica smoothing film (directly) on the substrate, said film being intended to smooth the roughness sufficiently (without planarizing the surface) and to form the textured surface of the structure.

This is because a texture having protrusions that are too pointed, with angles that are too sharp, would run the risk of causing an electrical contact between the anode and the cathode, thus degrading the OLED.

The method incorporates a step of controlling the roughness.

The choice of a rough glass according to the invention (and not textured with a pattern) ensures a random texture (preserved even after smoothing) making it possible to increase the extraction efficiency across a wide range of wavelengths (no visible colorimetric effect), and provide an almost Lambertian angular distribution for the emitted light.

In contrast, because it is periodic, the grating of the prior art optimizes the increase in extraction efficiency around a certain wavelength and does not promote white light emission; on the contrary, it has a tendency to select certain wavelengths and will emit for example more in the blue or in the red.

The roughness of the substrate is characterized by the well-known roughness parameter Ra, which is the arithmetic mean deviation of the profile, i.e. the average amplitude. In order to define the rough substrate it is possible to use, in addition to Ra, the well-known roughness parameter RSm, which is the average value of the widths of the elements of the profile. The parameter RSm may thus range from 40 µm to 100 µm, even more preferably from 45 to 65 µm, over an analysis length of 15 mm, and with a Gaussian filter having a cut-off frequency of 0.8 mm.

The analysis length is thus suitably chosen depending on the roughness to be measured.

The Gaussian cut-off filter serves to eliminate wavelengths in roughness ranges that are not pertinent for defining the roughness suitable for the invention.

For the roughness parameters it is also possible to refer to standard NF EN ISP 4287.

The roughness parameters of the rough surface of the glass may be measured in various ways:

by optical profilometry, using the principle of extended-field chromatic microscopy, for example using the MIM2 base unit from STIL; or by optical interferometry for example using the Newview apparatus from Zygo; or even using a mechanical tip system (using for example the measurement instruments sold by Veeco under the trade name Dektak).

Before smoothing, the height of the roughness peaks is micron-sized and the surface is uneven.

After smoothing the height of the texture is submicron-sized (nanoscale), with a rounded or wavy surface.

To define the smoothing of the surface of the smoothing film it is preferable to introduce a double roughness criterion:
- setting a maximum value for the well-known roughness parameter Rdq, which indicates the average slope; and
- setting a maximum value, optionally in addition to a minimum value (so as to promote extraction), for Rmax, the well-known roughness parameter that indicates the maximum height.

Thus, in one preferred embodiment, the textured surface of the structure is defined by a roughness parameter Rdq smaller than 1.5°, preferably smaller than 1°, even smaller than or equal to 0.7°, and a roughness parameter Rmax smaller than 250 nm, preferably smaller than or equal to 200 nm, over an analysis length of 180 µm, and with a Gaussian filter having a cut-off frequency of 25 µm.

The roughness parameters of the textured surface may be measured in various ways, for example:
- by optical interferometry, for example using the Newview apparatus from Zygo; or
- by a mechanical tip system (using for example measurement instruments sold by Veeco under the trade name Dektak); or else
- by optical profilometry, using the principle of extended-field chromatic microscopy, for example using the MIM2 base unit from STIL.

Another method of defining the smoothing of the textured surface by the smoothing film is to say that the angle formed between the tangent and the normal to the substrate is greater than or equal to 30°, and preferably at least 45°, for most of the given points of this surface.

To qualify the amount of texture on the surface of the smoothing film, it is furthermore possible to use the RMS (root mean square) parameter (or Rq), i.e. the quadratic mean deviation of the roughness, therefore quantifying the average height of the peaks and troughs in roughness, relative to the average height.

It is thus possible to choose an RMS smaller than 550 nm, even smaller than or equal to 500 nm, over an analysis length of 180 µm, and with a Gaussian filter having a cut-off frequency of 25 µm.

Preferably, for increased OLED reliability, at least 50%, even 70% and even 80% of the rough face of the substrate to be covered with the active film or films of the OLED (so as to form one or more lighting regions), has the submicron-sized texture sufficiently smoothed (typically rounded, wavy) by the overlying smoothing film according to the invention.

In other words, for a given number N of active light-emitting regions in an OLED, preferably at least 70%, even at least 80%, of the N active region(s) comprise a smoothed textured surface according to the invention.

For example, for simplicity of manufacture, the smoothing film substantially covers the rough surface. And the substrate may be rough substantially over all the main face in question.

To provide an analysis of the surface finish which is as representative as possible it is naturally possible to take a sufficient number of roughness measurements on the surface of the smoothing film, and this in a plurality of sectors of the active OLED region or regions. For example measurements are taken on surfaces in the center, even at the periphery, of the optionally preselected active regions.

For the smoothing, wet processing is preferred to physical deposition such as physical vapor deposition (PVD), because it ensures a profile that is not completely conformal to the uneven relief of the rough substrate, and therefore makes it possible to sufficiently smooth the roughness in an appropriate way.

Thus a substrate having a surface the profile of which is perfectly suited to use in an OLED, is easily obtained.

The deposition technique used to form the smoothing film, chosen to be a sol-gel film comprising deposition of at least one sol, and obtained using a wet process, may be, as is known, one of various techniques such as coating, impregnation in solution or dip coating, spray coating, spin coating, etc.

Preferably, the smoothing film may be chosen to take the form of a sol-gel film (over all the smoothing thickness or at least on its surface).

It will be recalled that formation of a sol-gel film has the advantage of being carried out at room temperature. The starting point is a homogeneous solution of molecular precursors that are converted into a solid via an inorganic chemical polymerization reaction at room temperature. The solution of relatively polymerized precursors is called a sol, and it is converted into a gel on aging. The uniform solid obtained is porous, amorphous, and densifies at low temperatures enabling, under mild conditions, the processing of glasses, ceramics or here a thin film.

To do this an initial composition of materials is prepared so as to obtain a final mixture of materials, called a "sol", by way of polymerization of the initial composition, this sol being deposited on the glass substrate and the sol being dried once deposited so as to form the smoothing film.

A smoothing film, chosen to be a sol-gel and/or a sol-gel binder, is made from a sol the initial composition of which is based on silicon alkoxide and optionally on an isopropanol type solvent.

This method, which is inexpensive, can advantageously be produced over large areas, and is completely reproducible.

In addition, there is no risk of the texture of the film obtained by sol-gel processing delaminating over time.

Finally, the product obtained withstands heat treatment, thermal tempering and/or the chemical treatments which are often subsequently necessary depending on the final destination of said product, such as its integration into an OLED.

By way of example, a silica sol-gel film is obtained from an initial composition based on silicon alkoxide, in particular tetraethoxysilane ($Si(OC_2H_5)_4$ called TEOS), and a solvent, isopropanol.

The formation of the smoothing film may comprise depositing a first film based on an aqueous dispersion of silica (nano)particles optionally with a silica binder, especially a silica sol-gel, and therefore of the same chemical nature as the (nano)particles.

The formation of the smoothing film may comprise depositing a dispersion of silica (nano)particles which is essentially free from binder, then depositing a film so as to form a silica binder for the (nano)particles, especially a silica sol-gel, and therefore of the same chemical nature as the (nano)particles, the binder penetrating through the thickness of the (nano)particles and covering the (nano)particles.

The smoothing film, especially a sol-gel, has a refractive index substantially equal to that of the glass. Its deposition is such that its surface is sufficiently wavy, preferably having an RMS parameter larger than 30 nm (larger than 50 nm, even larger than 150 nm), and/or a roughness parameter Rmax larger than or equal to 20 nm over an analysis length of 180 µm, and with a Gaussian filter having a cut-off frequency of 25 µm.

The random roughness of the substrate is preferably produced by a treatment of the glass substrate, in particular by acid etching, even by sandblasting.

The isotropy (preserved after smoothing) promotes white light emission.

The OLED comprises a first electrode deposited on the smoothing film. This first electrode, which takes the form of one or more thin films deposited directly on the smoothing film, may substantially conform to the surface (and thus preferably reproduce the texture after smoothing), for example it is deposited by vapor phase deposition and especially by magnetron sputtering or by evaporation.

The first electrode generally has an (average) index of 1.7 or more (1.8, even 1.9).

The one or more organic films of the OLED are deposited on this electrode; these films generally have an (average) index of 1.8 or more (1.9, even more).

The invention also relates to a structure having a textured surface, comprising a rough substrate made of mineral glass of roughness defined by a roughness parameter Ra ranging from 1 to 5 μm (preferably ranging from 1 to 3 μm) over an analysis length of 15 mm and with a Gaussian filter having a cut-off frequency of 0.8 mm, the rough surface being sufficiently smoothed by a silica smoothing film deposited (directly) on the rough substrate.

An industrial glass, especially a silicate, is preferably chosen, preferably it is inexpensive. It is preferably a soda-lime-silica glass.

According to one feature, the rough surface of the substrate preferably comprises randomly distributed, substantially pyramid-shaped protrusions.

Furthermore, according to one feature, the texture of the structure (in other words the surface of the smoothing film) is also random.

The textured surface of the structure (surface of the smoothing film) may be defined by a roughness parameter Rdq smaller than 1.5°, preferably smaller than 1°, even smaller than or equal to 0.7°, and a roughness parameter Rmax smaller than 250 nm, preferably smaller than or equal to 200 nm, over an analysis length of 180 μm, and with a Gaussian filter having a cut-off frequency of 25 μm.

The silica smoothing film, especially a sol-gel at least for the surface part thereof:
- is essentially inorganic, especially so as to have a good thermal withstand;
- is a dielectric (in the sense that it is a non-metal, for example it is based on oxides, optionally metal oxides) and preferably is an electrical insulator (in general having a bulk electrical resistivity, such as given in the literature, higher than $10^9$ Ω·cm) or a semiconductor (in general having a bulk electrical resistivity, such as given in the literature, higher than $10^{-3}$ Ω·cm and lower than $10^9$ Ω·cm); and/or
- preferably does not noticeably alter the transparency of the substrate; for example, the substrate coated with the smoothing film may have a light transmittance $T_L$ higher than or equal to 70%, even 80%.

The silica smoothing film, especially a sol-gel, has a refractive index substantially equal to that of the glass, especially a conventional glass having a refractive index of about 1.5. The smoothing film is deposited so that the surface of the film is sufficiently wavy, preferably having an RMS parameter larger than 30 nm, preferably larger than 50 nm, even larger than 150 nm, over an analysis length of 180 μm, and with a Gaussian filter having a cut-off frequency at 25 μm.

It is thus necessary to sufficiently smooth the texture to prevent electrical defects while keeping a certain level of texture on the surface so as to guarantee extraction. Specifically, the waviness interferes with the modal energy distribution.

According to one feature, the smoothing film has a thickness (in the troughs) ranging from 500 nm to 10 μm depending on the level of smoothing desired, and preferably ranging from 1 μm to 10 μm.

In the case of a sol-gel film, the smallest thickness is located on the peaks or protrusions of the relief, and the largest thickness in the troughs. This thickness is related to the solid content of the molecular-precursor-based initial composition. The solid content is defined as being the ratio of the mass of the materials in the sol present in the film after drying, to the mass of the materials in the initial composition. According to the invention, the solid content will advantageously range from 15% to 30%.

The smoothing film may be based on silica nanoparticles covered by a silica sol-gel. The nanoparticles have an average diameter preferably ranging from 10 to 50 nm so as to better limit and control the roughness of the deposit.

The (nano)particles may be deposited from dispersion in a solvent (alcohol, ketone, water, glycol, etc.).

In order to ensure better cohesion of the film, it is possible to favor mixing the particles in a silica (precursor) binder before depositing them (the binder then being distributed through the entire thickness of the filling film). The silica binder may be processed using sol-gel processing (inorganic or organic/inorganic hybrid, etc.). The silica binder may be based on organometallic precursors and therefore have the same chemical nature as the (nano)particles.

Another alternative is to cover the binder-free film based on silica (nano)particles with a silica binder. The binder penetrates between the nanoparticles (at least in the outermost part of the film) thus acting as a cement between the particles, for example at least through half the thickness. In addition, the binder that remains on the surface smoothes the surface and possibly protects the film from mechanical stresses.

Again, the binder may be a silica sol-gel based on organometallic precursors and therefore have the same chemical nature as the silica (nano)particles.

Lastly, the subject of the invention is an organic-light-emitting-diode device incorporating the structure having an external textured surface defined above, the textured surface of the structure being arranged on the side of the organic light-emitting film or films (OLED system), i.e. interior to the device, on the side opposite the face emitting light to the exterior of the device. The structure having an external textured surface is therefore under a first electrode underlying the organic light-emitting film or films.

The OLED may form a lighting panel, or a backlight (substantially white and/or uniform) especially having a (solid) electrode area larger than or equal to $1 \times 1$ cm$^2$, even as large as $5 \times 5$ cm$^2$ and even $10 \times 10$ cm$^2$ or larger.

Thus, the OLED may be designed to form a single lighting area (with a single electrode area) emitting (substantially white) polychromatic light or a multitude of lighting areas (having a plurality of electrode areas) emitting (substantially white) polychromatic light, each lighting area having a (solid) electrode area larger than or equal to $1 \times 1$ cm$^2$, even $5 \times 5$ cm$^2$ and even $10 \times 10$ cm$^2$ or larger.

Thus in an OLED according to the invention, especially for lighting, it is possible to choose a nonpixelated electrode. It differs from display-screen (LCD, etc.) electrodes that are formed of three juxtaposed, generally very small, pixels, each emitting a given, almost monochromatic light (typically red, green or blue light).

The OLED system may be able to emit a polychromatic light defined, at 0°, by the (x1, y1) coordinates in the XYZ 1931 CIE color diagram, coordinates given therefore for light incident at a right angle.

The OLED may be back emitting and optionally also front emitting depending on whether the top electrode is reflective or, respectively, semireflective or even transparent (especially having a $T_L$ comparable to the anode, typically higher than 60% and preferably higher than or equal to 80%).

The OLED may furthermore comprise a top electrode on top of said OLED system.

The OLED system may be able to emit (substantially) white light, having coordinates as close as possible to (0.33; 0.33) or (0.45; 0.41), especially at 0°.

To produce a substantially white light several methods are possible: component (red, green and blue emission) mixture in a single film; a multilayer, on the face of the electrodes, of three organic structures (red, green and blue emission) or of two organic structures (yellow and blue).

The OLED may be able to produce as output (substantially) white light, having coordinates as close as possible to (0.33; 0.33) or (0.45; 0.41), especially at 0°.

The device may be part of a multiple glazing unit, especially glazing having a vacuum cavity or a cavity filled with air or another gas. The device may also be monolithic, comprising a monolithic glazing pane so as to be more compact and/or lighter.

The OLED may be bonded, or preferably laminated using a lamination interlayer, with another planar substrate, called a cap, which is preferably transparent, such as glass, and is especially extra-clear glass.

The invention also relates to the various applications that may be found for these OLEDs, used to form one or more transparent and/or reflective (mirror function) light-emitting surfaces placed externally and/or internally.

The device may form (alternatively or cumulatively) a lighting system, a decorative system, or an architectural system etc., or a display panel for signs, for example a design, logo or alphanumeric sign, especially an emergency exit sign.

The OLED may be arranged so as to produce a uniform polychromatic light, especially for a uniform lighting, or to produce various light-emitting regions, having the same intensity or different intensities.

When the electrodes and the organic structure of the OLED are chosen to be transparent, it is possible especially to produce a light-emitting window. The improvement in the illumination of the room is then not produced to the detriment of the transmission of light. Furthermore, by limiting reflection of light, especially from the external side of the light-emitting window, it is also possible to control the reflectance level for example so as to meet anti-dazzle standards in force for the curtain walling of buildings.

More widely, the device, especially transparent in part(s) or everywhere, may be:
  intended for use in a building, such as for a light-emitting external glazing unit, a light-emitting internal partition or a (or part of a) light-emitting glazed door, especially a sliding door;
  intended for use in a means of transport, such as for a light-emitting roof, a (or part of a) light-emitting side window, a light-emitting internal partition for a terrestrial, maritime or aerial vehicle (automobile, lorry, train, airplane, boat, etc.);
  intended for use in an urban or professional setting such as for a bus shelter panel, a wall of a display cabinet, a jeweler's display case or a shop window, a wall of a greenhouse, a light-emitting tile;
  intended for use as an internal fitting, such as for a shelf or furniture element, a front face for an item of furniture, a light-emitting tile, a ceiling light or lamp, a light-emitting refrigerator shelf, an aquarium wall; or
  intended for backlighting of a piece of electronic equipment, especially a display screen, optionally a double screen, such as a television or computer screen or a touch screen.

OLEDs are generally separated into two broad families depending on the organic material used.

If the electroluminescent films are formed from small molecules, SM-OLEDs (small molecule organic light-emitting diodes) are spoken of. Generally, the structure of an SM-OLED consists of a hole-injection-film multilayer (HIL), a hole transporting film (HTF), a light-emitting film and an electron transporting film (ETF).

Examples of organic light-emitting multilayers are for example described in the document entitled "four wavelength white organic light emitting diodes using 4,4'-bis-[carbazoyl-(9)]-stilbene as a deep blue emissive film" by C. H. Jeong et al. published in Organic Electronics 8 (2007) pages 683-689.

If the organic light-emitting films are polymers, PLEDs (polymer light-emitting diodes) are spoken of.

The present invention is now described using uniquely illustrative examples that in no way limit the scope of the invention, and using the appended drawings, in which.

Figure 1:
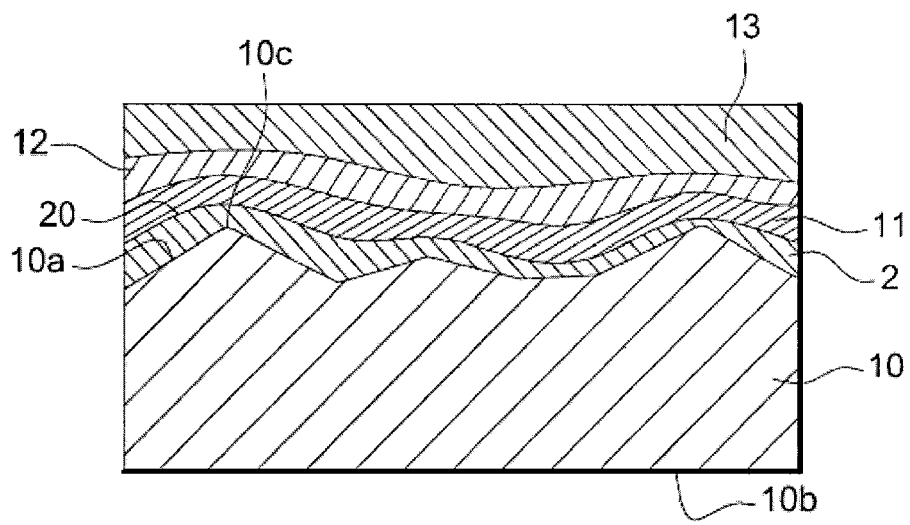
FIG. 1 shows a schematic cross-sectional view of an OLED the glass substrate of which is rough and sufficiently smoothed according to the invention.

FIG. 1, which is not to scale so as to be more easily understood, shows schematically an organic-light-emitting-diode device 1 that comprises in succession:
  a rough substrate, having an uneven profile with possibly micron-sized reliefs, made of soda-lime glass, which has first and second opposed main faces 10a and 10b;
  a smoothing film 2, with a surface 20 having a nanoscale texture in the form of an alternation of peaks or protrusions 10c and troughs, the peaks having rounded profiles;
  a first transparent electrically conductive coating 11 that forms a first electrode;
  a film 12 of one or more organic materials; and
  a second electrically conductive coating 13 that forms a second electrode, and preferably has, facing the organic film 12, a (semi)reflective surface intended to reflect light emitted by the organic film in back towards the transparent substrate 10 from which the light exits.

The first electrode 11, or the bottom electrode, comprises for example a transparent electrically conductive coating such as those based on tin-doped indium oxide (ITO) or a silver-containing multilayer.

The silver-containing electrode multilayer comprises for example:
  an optional base film (and/or) a wet-etch-stop film;
  an optional mixed-oxide subfilm based on, optionally doped, zinc and tin or a film of mixed indium and tin oxide (ITO) or a film of mixed indium and zinc oxide (IZO);
  a contact film based on a metal oxide chosen from $ZnO_x$ whether doped or not, $Sn_yZn_zO_x$, ITO or IZO;
  a functional metal film, for example containing silver, that is intrinsically electrically conductive;

an optional thin overblocker film directly on the functional film, the thin overblocker film comprising a metal film having a thickness smaller than or equal to 5 nm and/or a film having a thickness smaller than or equal to 10 nm, based on a substoichiometric metal oxide, a substoichiometric metal oxynitride, or a substoichiometric metal nitride (and optionally a thin underblocker film directly below the functional film);

an optional protective film chosen from $ZnO_x$, $Sn_yZn_zO_x$, ITO or IZO; and an overfilm based on a metal oxide for matching the work function of said electrode coating.

It is possible for example to choose as the electrode multilayer:

$Si_3N_4$/ZnO:Al/Ag/Ti or NiCr/ZnO:Al/ITO, having respective thicknesses of 25 nm for the $Si_3N_4$, 5 to 20 nm for the ZnO:Al, 5 to 15 nm for the silver, 0.5 to 2 nm for the Ti or NiCr, 5 to 20 nm for the ZnO:Al and 5 to 20 nm for the ITO.

On the optional base films and/or wet-etch-stop films and/or subfilms is arranged n times the following structure, where n is an integer greater than or equal to 1 (especially n=2, i.e. a silver-containing bilayer):

the contact film;
optionally the thin underblocker film;
the functional film;
the thin overblocker film; and
optionally the film protecting against water and/or oxygen.

The final film is still the overfilm.

Thus mention may be made of a silver-containing multilayer, for example as described in documents WO 2008/029060 and WO 2008/059185.

The multilayer of organic OLED films comprises a central light-emitting film intermediate between an electron transporting film and a hole transporting film, themselves intermediate between an electron injection film and a hole injection film.

The second electrode of the OLED, or top electrode, is made of an electrically conductive and preferably (semi)reflective material, in particular a metal such as silver or aluminum.

In order to ensure better light extraction, the second face 10*b* of the substrate facing the first electrode 11 is therefore rough, comprising protrusions 10*c* and troughs in alternation.

The roughness 10*c* is obtained by removing the polish of a glass substrate using for example hydrofluoric acid. An example of a rough substrate is the glass called DecorFlou® produced by Omnidecor (satin appearance).

It is also possible to choose other glasses etched with acid such as for example:

the glass called SatenGlass® produced by Sevasa;
the glass called SATINOVO® produced by La Veneciana (Saint Gobain); and
the glass called Dekormat® produced by Dekormat Glass.

The roughness may also be produced by sandblasting.

To measure the roughness an optical profilometer is used, according to the principle of extended-field chromatic microscopy, for example using the MIM2 base unit from STIL.

An analysis length of 15 mm is chosen with a Gaussian filter having a cut-off frequency of 0.8 mm.

It is possible to repeat this measurement 30 times with profiles separated by 1 mm.

An Ra parameter of 2 µm and an Rsm parameter of 60 µm are obtained.

Figure 2:
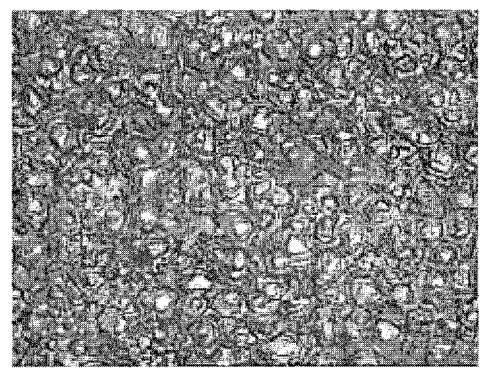
FIG. 2 is an optical photo of the rough surface of the glass before deposition of the smoothing film.

FIG. 2 shows an optical micrograph of the rough surface of this glass having protrusions 10*c* at a ×20 magnification in a measurement region.

The protrusions are substantially pyramid shaped and are distributed randomly, scattering the light isotropically.

The inventors have demonstrated that it is paramount for the external surface of the structure that must receive the electrode to be free from any sharp points.

Thus, to guarantee that this requirement is met, it is possible to choose a smoothing film with a textured surface defined by a roughness parameter Rdq smaller than 1.5°, and a roughness parameter Rmax smaller than 250 nm over an analysis length of 180 µm and with a Gaussian filter having a 25 µm cut-off.

The tangent to most points of the textured surface 20 may also form with the normal to the opposed planar face 10*a* an angle larger than or equal to 30° and preferably at least 45°.

To do this, the smoothing film 2 is a silica sol-gel film, produced by a wet process.

An initial composition of materials is prepared so as to obtain a final mixture of materials, called a "sol", by way of polymerization of the initial composition, this sol being deposited on the glass substrate and the sol being dried once deposited so as to form the smoothing film.

The initial composition is made from precursor molecules, in particular alkoxide precursor molecules, optionally with one or more complexing agents for controlling the degree of polymerization, and with one or more solvents for diluting the precursor molecules.

The sol is preferably deposited using a wet process, using a coating technique, for example using a spinner (spin coating).

The thickness is directly related to the solid content of the film. The solid content is defined as being the ratio of the mass of the materials in the sol present in the film after drying, to the mass of the materials in the initial composition.

Two exemplary embodiments of silica smoothing films on rough glass substrates are given below.

EXAMPLE 1

The smoothing film was a silica film having a refractive index substantially equal to that of glass.

The initial composition was based on two silicon alkoxides, tetraethoxysilane ($Si(OC_2H_5)_4$ called TEOS) and methyltriethoxysilane ($CH_3Si(OC_2H_5)_3$ called MTEOS), which were used in water acidified with hydrochloric acid so as to obtain a pH of 2.5. The molar percentage of MTEOS relative to the sum of TEOS+MTEOS was 70%.

The preparation of the composition consisted in:

mixing 6.7 g of TEOS and 13.5 g of MTEOS in 4.8 g of deionized water acidified with HCl (the pH of the water being equal to 2.5); and
stirring the mixture for two hours at room temperature.

The sol obtained had a solid content of 28%.

The sol obtained was then deposited by spin coating at 500 revs/min on the rough DecorFlou® glass substrate described above, and then dried for half an hour at 120° C.

The silica ($SiO_2$) film obtained had a refractive index equal to 1.42.

Figure 3A:
FIG. 3a is a micrograph of a cross section through the rough glass coated with a sol-gel smoothing film, taken using a scanning electron microscope.

FIG. 3*a* is a SEM image, at ×5000 magnification, of a cross section through the rough glass coated with this sol-gel smoothing film.

Figure 3B:
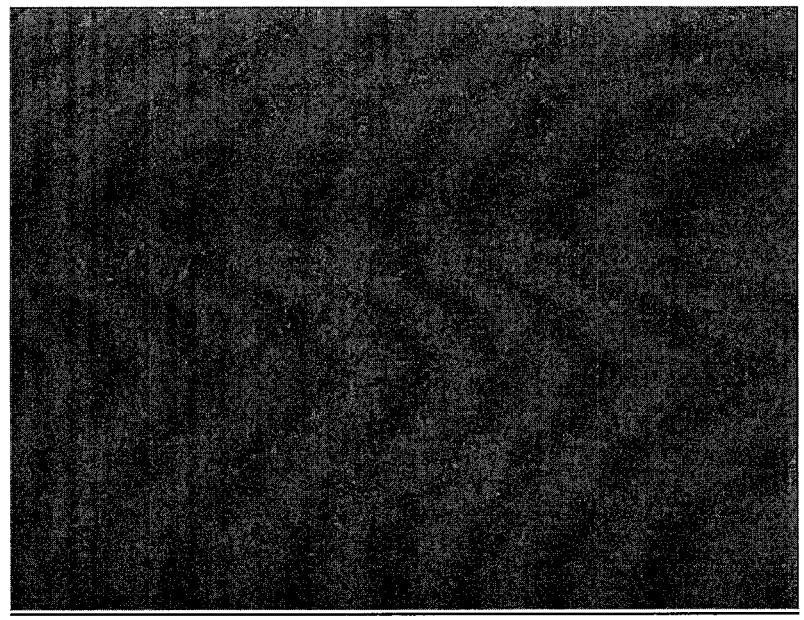
FIG. 3b is a micrograph of the surface of the rough glass coated with a sol-gel smoothing film, taken using an optical microscope.

FIG. 3*b* is a top view of the surface of this smoothing film, seen with an optical microscope at a magnification of ×20, having dimensions of 690 µm by 500 µm.

SEM analysis showed that the smoothing film had a thickness of about 8 µm in the troughs and a smaller thickness on the "ridges" or protrusions.

For the roughness measurements an optical interferometer, for example the Newview apparatus from Zygo, was used.

Using an analysis length of 180 μm with a Gaussian filter having a cut-off frequency at 25 μm the following results were obtained:
- an Rdq of 0.7°;
- an Rmax of 190 nm;
- an Ra of 25.8 nm; and
- an RMS of 492 nm.

The surface of the smoothing film met the particular criteria for the glass-electrode interface in an OLED.

EXAMPLE 2

The smoothing film was formed in two steps. From an initial composition based on $SiO_2$ nanoparticles, a first film was easily formed which was sufficiently thick for a first level of smoothing of the glass. This first film of nanoparticles was then coated with a top coat so as to eliminate the roughness generated by the nanoparticles themselves for a second level of smoothing, preserving a sufficient texture.

The top coat was based on a silicon alkoxide and a solvent, isopropanol.

The initial composition of the first film was a dispersion, for example an aqueous dispersion, of $SiO_2$ nanoparticles. The size of the nanoparticles was for example 20 nm. The solid content of the dispersion was 20%.

The smoothing was produced by:
- depositing the aqueous dispersion of $SiO_2$ nanoparticles on an intrinsically textured SATINOVO® glass substrate by spin coating at 500 revolutions per minute;
- preferably drying this first film for 1 hour at 120° C.;
- depositing the silica precursor composition of the top coat by spin coating at 500 revolutions per minutes; and
- drying the whole for 30 minutes at 120° C.

The invention claimed is:

1. A method for manufacturing a structure having a textured surface, comprising a substrate made of mineral glass having a given texture, for an organic-light-emitting-diode device, the method comprising:
   supplying a rough substrate, having a roughness defined by a roughness parameter Ra ranging from 1 to 5 μm over an analysis length of 15 mm and with a Gaussian filter having a cut-off frequency of 0.8 mm; and
   depositing a liquid-phase silica smoothing film on the substrate, said film being configured to smooth the roughness sufficiently and to form the textured surface of the structure,
   wherein the textured surface of the structure is defined by a roughness parameter Rdq smaller than 1.5°, and by a roughness parameter Rmax smaller than 250 nm, over an analysis length of 180 μm and with a Gaussian filter having a cut-off frequency of 25 μm.

2. The method as claimed in claim 1, wherein formation of the smoothing film, chosen to be a sol-gel film comprising deposition of at least one sol, is carried out using a coating, or impregnation in solution or dip coating, or spray coating, or spin coating.

3. The method as claimed in claim 1, wherein formation of the smoothing film comprises depositing a first film based on an aqueous dispersion of silica (nano)particles optionally with a binder.

4. The method as claimed in claim 1, wherein formation of the smoothing film comprises depositing a dispersion of silica (nano)particles which is essentially free from binder, and then depositing a film so as to form a silica binder for the (nano) particles, the binder penetrating through the thickness of the (nano)particles and covering the (nano)particles.

5. The method as claimed in claim 1, wherein the smoothing film, chosen to be a sol-gel and/or the sol-gel binder, is made from a sol the initial composition of which is based on silicon alkoxide and optionally based on an isopropanol type solvent.

6. The method as claimed in claim 1, wherein the roughness is obtained by acid etching.

7. A structure having a textured surface, comprising a rough substrate made of mineral glass of roughness defined by a roughness parameter Ra ranging from 1 to 5 μm over an analysis length of 15 mm and with a Gaussian filter having a cut-off frequency of 0.8 mm, and a silica smoothing film deposited on a surface of the rough substrate to smoothen the surface of the rough substrate, wherein the textured surface of the structure defined by an outer surface of the silica smoothing film is defined by a roughness parameter Rdq smaller than 1.5°, and by a roughness parameter Rmax smaller than 250 nm, over an analysis length of 180 μm, and with a Gaussian filter having a cut-off frequency of 25 μm.

8. The structure as claimed in claim 7, wherein the smoothing film is a sol-gel at least for the surface part thereof.

9. The structure as claimed in claim 7, wherein the smoothing film is based on $SiO_2$ nanoparticles covered by a silica sol-gel.

10. An organic-light-emitting-diode device comprising a structure having an external textured surface, the structure comprising a rough substrate made of mineral glass of roughness defined by a roughness parameter Ra ranging from 1 to 5 μm over an analysis length of 15 mm and with a Gaussian filter having a cut-off frequency of 0.8 mm, and a silica smoothing film deposited on a surface of the rough substrate, the textured surface defined by an outer surface of the silica smoothing film being arranged on a side of an organic light-emitting film, under a first electrode underlying the organic light-emitting film,
   wherein the textured surface of the structure defined by the outer surface of the silica smoothing film is defined by a roughness parameter Rdq smaller than 1.5°, and by a roughness parameter Rmax smaller than 250 nm, over an analysis length of 180 μm, and with a Gaussian filter having a cut-off frequency of 25 μm.

11. An organic-light-emitting-diode device comprising a structure having a textured surface structure as claimed in claim 8, the textured surface being arranged on a side of an organic light-emitting film, under a first electrode underlying the organic light-emitting film.

12. The organic-light-emitting-diode device as claimed in claim 10, wherein the silica smoothing film is based on $SiO_2$ nanoparticles covered by a silica sol-gel.

13. The organic-light-emitting-diode device as claimed in claim 10, wherein the silica smoothing film has a thickness in troughs from 1 μm to 10 μm.

14. The organic-light-emitting-diode device as claimed in claim 10, wherein, for a majority of points of the outer surface of the silica smoothing film, an angle formed between a tangent and a normal, to a second surface of the substrate opposite said surface of the rough substrate, is greater than or equal to 30°.

15. The organic-light-emitting-diode device as claimed in claim 14, wherein the angle is greater than 45°.

16. The organic-light-emitting-diode device as claimed in claim 10, wherein the electrode is in contact with the silica smoothing film.

* * * * *

UNITED STATES PATENT AND TRADEMARK OFFICE
CERTIFICATE OF CORRECTION

Page 1 of 1

PATENT NO. : 8,753,906 B2
APPLICATION NO. : 13/260970
DATED : June 17, 2014
INVENTOR(S) : Vermersch et al.

It is certified that error appears in the above-identified patent and that said Letters Patent is hereby corrected as shown below:

On title page, item [56]
delete "DE 20 2005 000 9   7/2006"
and insert -- DE 20 2005 000 979   7/2006 --

In the claims
Column 12, claim 11, line 46
delete "claim 8"
and insert -- claim 7 --

Signed and Sealed this
Second Day of September, 2014

Michelle K. Lee
*Deputy Director of the United States Patent and Trademark Office*